(12) United States Patent
Modi et al.

(10) Patent No.: US 11,705,377 B2
(45) Date of Patent: Jul. 18, 2023

(54) STACKED DIE CAVITY PACKAGE

(71) Applicant: Intel Corporation, Santa Clara, CA (US)

(72) Inventors: Mitul Modi, Phoenix, AZ (US); Robert L. Sankman, Phoenix, AZ (US); Debendra Mallik, Chandler, AZ (US); Ravindranath V. Mahajan, Chandler, AZ (US); Amruthavalli P. Alur, Tempe, AZ (US); Yikang Deng, Chandler, AZ (US); Eric J. Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/720,202

(22) Filed: Apr. 13, 2022

(65) Prior Publication Data
US 2022/0238402 A1   Jul. 28, 2022

Related U.S. Application Data

(62) Division of application No. 16/463,638, filed as application No. PCT/US2016/068722 on Dec. 27, 2016, now Pat. No. 11,328,968.

(51) Int. Cl.
*H01L 23/13* (2006.01)
*H01L 21/48* (2006.01)
(Continued)

(52) U.S. Cl.
CPC .......... *H01L 23/13* (2013.01); *H01L 21/4857* (2013.01); *H01L 21/565* (2013.01);
(Continued)

(58) Field of Classification Search
CPC ....................................................... H01L 23/13
See application file for complete search history.

(56) References Cited

U.S. PATENT DOCUMENTS

| | | |
|---|---|---|
| 2011/0317381 A1 | 12/2011 | Kim et al. |
| 2012/0228754 A1 | 9/2012 | Liu et al. |

(Continued)

FOREIGN PATENT DOCUMENTS

| | | |
|---|---|---|
| CN | 103219324 | 7/2013 |
| JP | 2007250916 | 9/2007 |

(Continued)

OTHER PUBLICATIONS

Final Office Action for U.S. Appl. No. 16/463,638, dated Sep. 21, 2021.

(Continued)

*Primary Examiner* — Mounir S Amer
(74) *Attorney, Agent, or Firm* — Essential Patents Group, LLP

(57) ABSTRACT

An apparatus is provided which comprises: a plurality of dielectric layers forming a substrate, a plurality of first conductive contacts on a first surface of the substrate, a cavity in the first surface of the substrate defining a second surface parallel to the first surface, a plurality of second conductive contacts on the second surface of the substrate, one or more integrated circuit die(s) coupled with the second conductive contacts, and mold material at least partially covering the one or more integrated circuit die(s) and the first conductive contacts. Other embodiments are also disclosed and claimed.

7 Claims, 7 Drawing Sheets

(51) Int. Cl.
  *H01L 21/56* (2006.01)
  *H01L 23/31* (2006.01)
  *H01L 23/498* (2006.01)
  *H01L 25/065* (2023.01)
  *H01L 25/18* (2023.01)
  *H01L 25/00* (2006.01)
  *H01L 23/00* (2006.01)

(52) U.S. Cl.
  CPC .... *H01L 23/3128* (2013.01); *H01L 23/49816* (2013.01); *H01L 23/49822* (2013.01); *H01L 25/0657* (2013.01); *H01L 25/18* (2013.01); *H01L 25/50* (2013.01); *H01L 21/4853* (2013.01); *H01L 24/16* (2013.01); *H01L 24/32* (2013.01); *H01L 24/48* (2013.01); *H01L 24/73* (2013.01); *H01L 2224/16146* (2013.01); *H01L 2224/16227* (2013.01); *H01L 2224/32145* (2013.01); *H01L 2224/48091* (2013.01); *H01L 2224/48106* (2013.01); *H01L 2224/48227* (2013.01); *H01L 2224/73253* (2013.01); *H01L 2224/73265* (2013.01); *H01L 2225/0651* (2013.01); *H01L 2225/06513* (2013.01); *H01L 2225/06517* (2013.01); *H01L 2225/06541* (2013.01); *H01L 2225/06565* (2013.01); *H01L 2225/06586* (2013.01); *H01L 2924/1432* (2013.01); *H01L 2924/1434* (2013.01)

(56) References Cited

U.S. PATENT DOCUMENTS

| | | |
|---|---|---|
| 2013/0069247 A1 | 3/2013 | Rahman et al. |
| 2013/0099368 A1 | 4/2013 | Han |
| 2014/0103527 A1 | 4/2014 | Marimuthu et al. |
| 2015/0062848 A1 | 3/2015 | Lee et al. |
| 2015/0179608 A1 | 6/2015 | Sung et al. |
| 2015/0206848 A1 | 7/2015 | Boja et al. |
| 2016/0099205 A1 | 4/2016 | Kwon et al. |
| 2016/0338202 A1 | 11/2016 | Park et al. |

FOREIGN PATENT DOCUMENTS

| | | |
|---|---|---|
| KR | 20130042936 | 4/2013 |
| KR | 20150073472 | 7/2015 |
| WO | 2016099463 | 6/2016 |

OTHER PUBLICATIONS

International Preliminary Report on Patentability from PCT/US2016/068722 dated Jul. 11, 2019, 13 pgs.
International Search Report and Written Opinion for International Patent Application No. PCT/US2016/068722 dated Sep. 25, 2017.
Notice of Allowance for U.S. Appl. No. 16/463,638, dated Jan. 27, 2022.
Office Action for U.S. Appl. No. 16/463,638, dated Jun. 3, 2021.
Office Action for Chinese. Patent Application No. 201680091161.3, dated Oct. 8, 2022.

STACKED DIE CAVITY PACKAGE

CLAIM FOR PRIORITY

This Application is a Divisional of U.S. patent application Ser. No. 16/463,638, filed on 23 May 2019 and titled "STACKED DIE CAVITY PACKAGE", which is a National Stage Entry of, and claims priority to, PCT Application No. PCT/US16/68722, filed on 27 Dec. 2016 and titled "STACKED DIE CAVITY PACKAGE", which is incorporated by reference in its entirety for all purposes.

BACKGROUND

As computing devices, such as smartphones, continue to increase in performance and capabilities, while shrinking in size, the use of package-on-package (PoP) architectures has expanded. Substrates designed for PoP architectures not only require space to attach devices, but also space for routing of interconnects and vias to facilitate communication with the devices.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
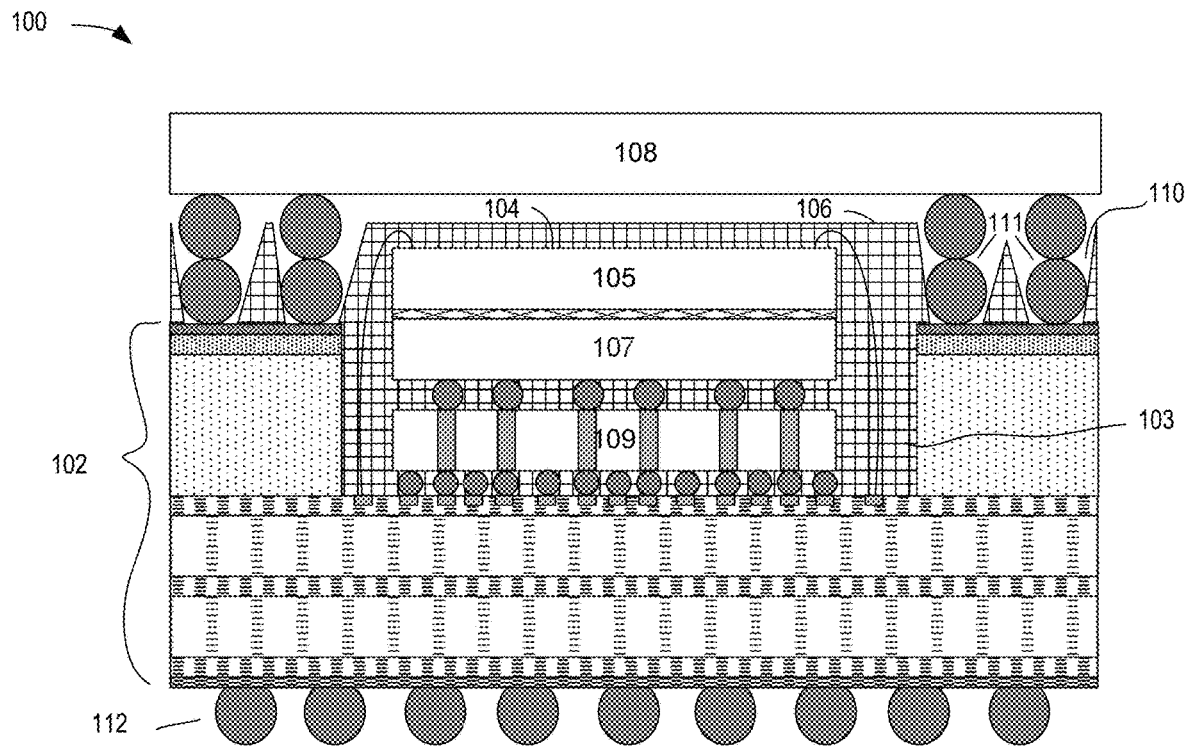
FIG. 1 illustrates a cross-sectional view of a stacked die cavity package, according to some embodiments.

Stacked die cavity packages are generally presented. In this regard, embodiments of the present invention enable traditional top side ball attach, mold, and through-mold interconnect (TMI) drilling with large dies and die stacks. One skilled in the art would appreciate that these packages may avoid form factor growth, PoP pin reduction, and very tall through-mold interconnect joints, such as double top side solder balls.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a cross-sectional view of a stacked die cavity package, according to some embodiments. As shown, package 100 includes cavity substrate 102, die stack 104, mold compound 106, device 108, through-mold vias 110, and package contacts 112. Package 100 may be formed using methods described hereinafter in relation to various embodiments, however other variations and alternatives may occur to one skilled in the art without deviating from the scope of the present invention.

Cavity substrate 102 may be formed from multiple layers of dielectric material interspersed with conductive material. In some embodiments, cavity substrate 102 comprises multiple layers of reinforced fabric which has been pre-impregnated with a resin system, commonly referred to a prepreg. While not shown for ease of depiction, a plurality of conductive traces and vias would likely be present in cavity substrate 102 to provide power and/or data to and/or from die stack 104 and device 108. While shown as including one centrally situated cavity 103, cavity substrate 102 may include any number of cavities in any arrangement.

Die stack 104 may represent a relatively large die or die stack that might benefit from teachings of the present invention. In some embodiments, die stack 104 represents two or more dies that are coupled in-situ, however any number of dies may be used and may be pre-coupled as part of another manufacturing process. In some embodiments, die stack 104 may include one or more processors, field programmable gate arrays (FPGAs), co-processors, controllers, memories and/or other integrated circuit devices. Dies 105, 107 and 109 of die stack 104 may be physically and/or electrically coupled in any conceivable way, including, but not limited to, the examples presented hereinafter.

Mold compound 106 may provide stability and/or insulation for die stack 104. In some embodiments, mold compound 106 contains an epoxy resin that may or may not require curing steps. Mold compound 106 may be formulated based on various factors, including but not limited to flow rates, cure times, thermal expansion, and ease of laser drilling.

Device 108 may be any type of device package that may benefit from teachings of the present invention. In some embodiments, device 108 is a memory device. While shown as a single device that spans a cavity in cavity substrate 102 above die stack 104, device 108 may be multiple device packages. In some embodiments, device 108 is coupled with cavity substrate 102 by through-mold vias 110, which may include laser drilled openings in mold compound 106 to expose solder spheres 111, or other forms, on a surface of cavity substrate 102, in some embodiments the same device 108 is coupled with solder spheres on opposite sides of a cavity in cavity substrate 102.

Package contacts 112 may include bumps or other conductive contacts to allow package 100 to be coupled with a printed circuit board, for example, as part of an integrated system. In some embodiments, pins, lands, or pads may be used.

Figure 2A:
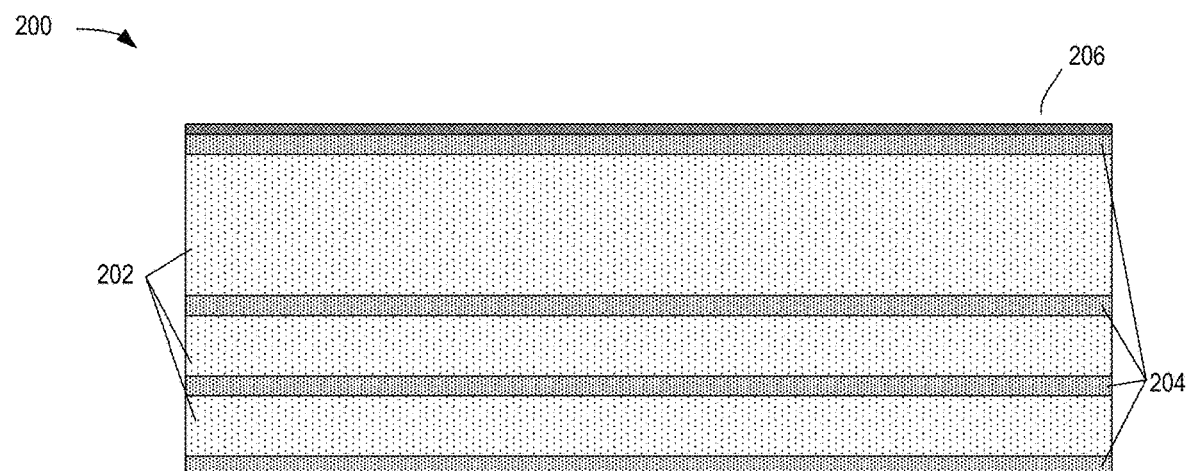
FIGS. 2A-2I illustrate cross-sectional views of manufacturing steps of a stacked die cavity package, according to some embodiments.

FIGS. 2A-2I illustrate cross-sectional views of manufacturing steps of a stacked die cavity package, according to some embodiments. As shown in FIG. 2A, assembly 200 includes dielectric layers 202, metal layers 204, top surface 206 and bottom surface 208.

Dielectric layers 202 may represent iteratively formed dielectric material insulating metal traces and vias (not shown). In some embodiments, dielectric layers 202 are layers of prepreg material. Dielectric layers 202 may be consistent in thickness or may vary in thickness.

Metal layers 204 may route signals and power through a substrate. In some embodiments, metal layers 204 are copper, though other metals may be used. In some embodiments, one or more metal layers 204 may be included to provide structural stability to act as a substrate core.

In some embodiments, top surface 206 and bottom surface 208 are solder resist or solder mask to protect copper traces against oxidation and to prevent solder bridges from forming between closely spaced solder pads. In some embodiments, top surface 206 and bottom surface 208 represent a layer of liquid epoxy that is sprayed or silkscreened on to an adjacent metal layer 204 and then cured.

Figure 2B:
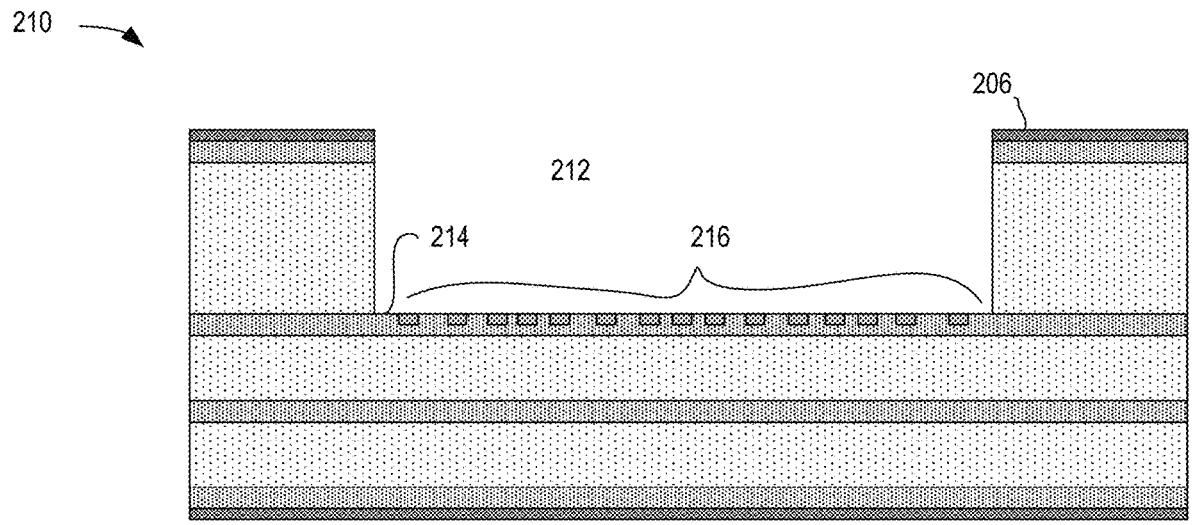

FIG. 2B shows assembly 210, which may include cavity 212, formed through top surface 206, cavity surface 214 and cavity contacts 216. In some embodiments, cavity 212 is formed by removing a cuboid portion of dielectric layers 202 down to an adjacent metal layer 204. In some embodiments, cavity 212 is formed by laser release or by mechanical routing. In some embodiments, cavity 212 has a depth of between about 100 um and 300 um, though other depths may be used.

The formation of cavity 212 may create a cavity surface 214 parallel to top surface 206. In some embodiments, cavity contacts 216 are formed within or over cavity surface 214. In some embodiments, a metal layer 204 that was designed to provide cavity surface 214 had cavity contacts 216 previously formed thereon, and the creation of cavity 212 exposes cavity contacts 216.

Figure 2C:
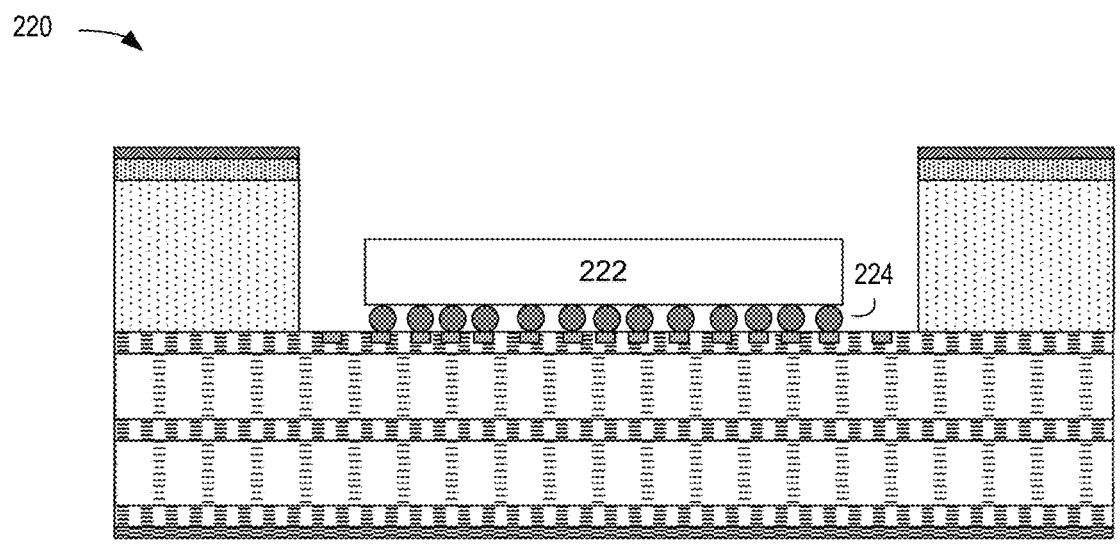

As shown in FIG. 2C, assembly 220 has had first device 222 coupled with cavity contacts 216. In some embodiments, first device 222 includes solder balls 224 for coupling with some, or perhaps all, of cavity contacts 216. Other contact means besides solder balls may be used in other embodiments.

Figure 2D:
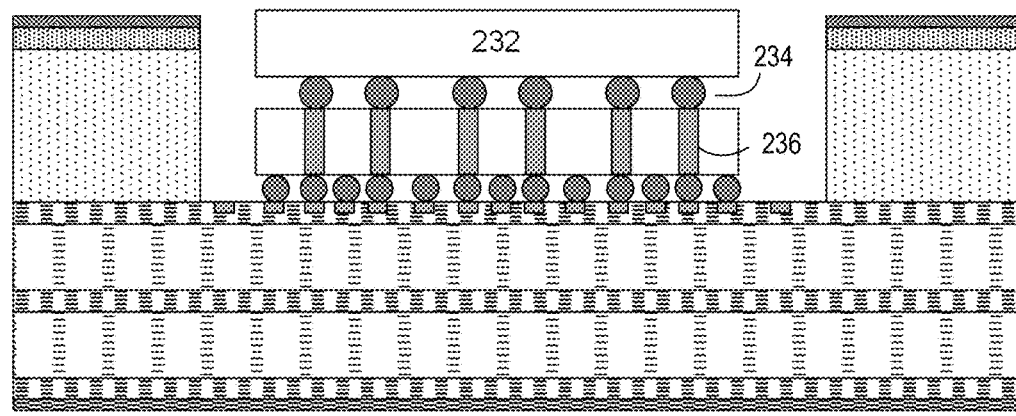

Turning now to FIG. 2D, assembly 230 may include second device 232 coupled with first device 222. In some embodiments, second device 232 includes solder balls 234, or other conductive fittings, that couple with through-silicon vias 236 within first device 222. Through-silicon vias 236 may conductively couple second device 232 with some of cavity contacts 216.

Figure 2E:
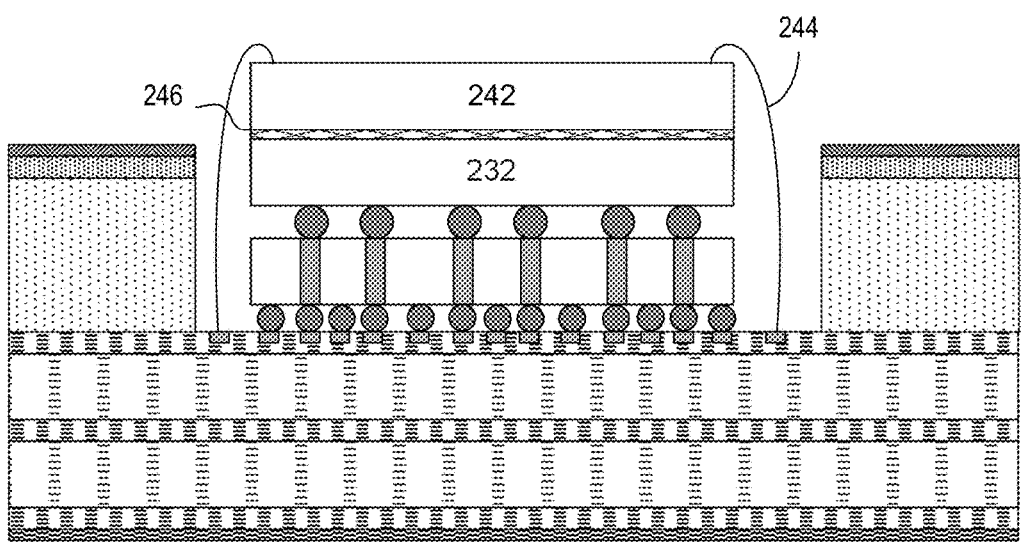

FIG. 2E shows assembly 240, which may include third device 242 attached to second device 232. In some embodiments, third device 242 is mechanically bonded with second device 232 by adhesive 246. In some embodiments, electrical connections with third device 242 are provided by wirebonds 244, which may couple with some of cavity contacts 216.

Figure 2F:
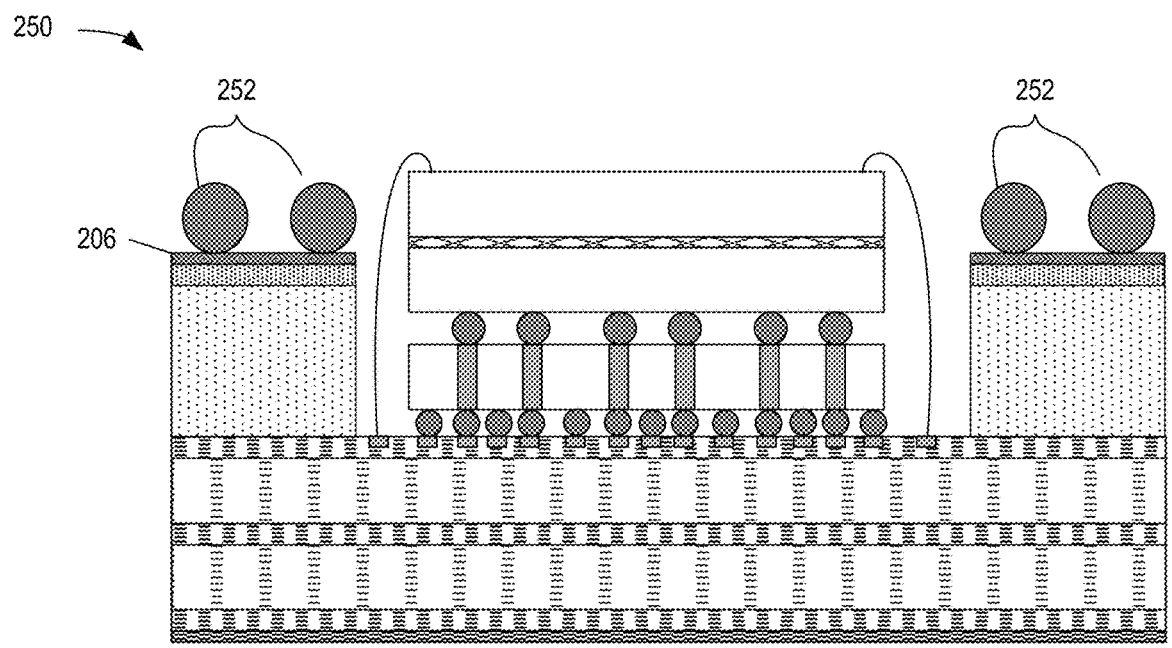

As shown in FIG. 2F, for assembly 250, solder spheres 252 may have been formed on top surface 206. In some embodiments, solder spheres 252 do not extend as far away from top surface 206 as the top of the die stack (for example, third device 242). Solder spheres 252 may be made from tin-based solder, lead-based solder, or other conductive materials. While referred to based on a general shape, solder spheres 252 may not be completely or perfectly spherical. One skilled in the art would appreciate that the term sphere is used informally and that other shapes/forms may be used.

Figure 2G:
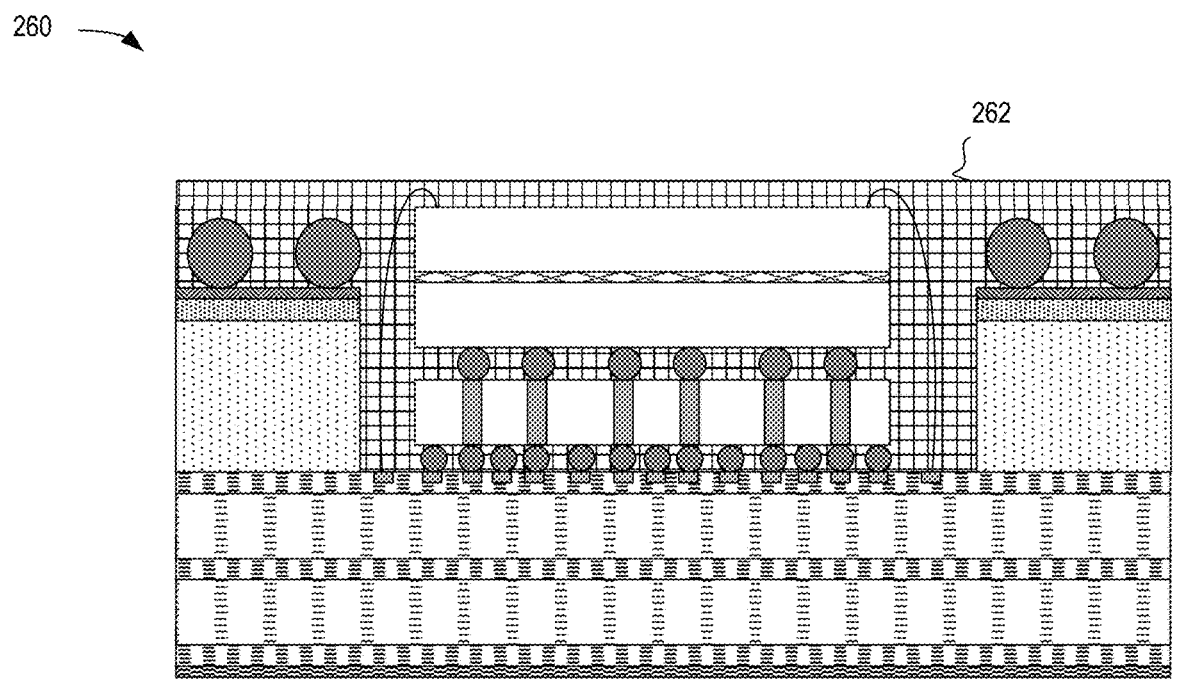

Turning now to FIG. 2G, assembly 260 may include mold compound 262 formed above top surface 206 and filling cavity 212. While shown as having a level upper surface that completely covers solder spheres 252, mold compound 262 may be deposited unevenly, for example in a way that conforms to other surfaces, such as those of solder spheres 252 and third device 242. In other embodiments, mold compound 262 is prevented from completely covering solder spheres 252, for example through the use of a temporary barrier.

Figure 2H:
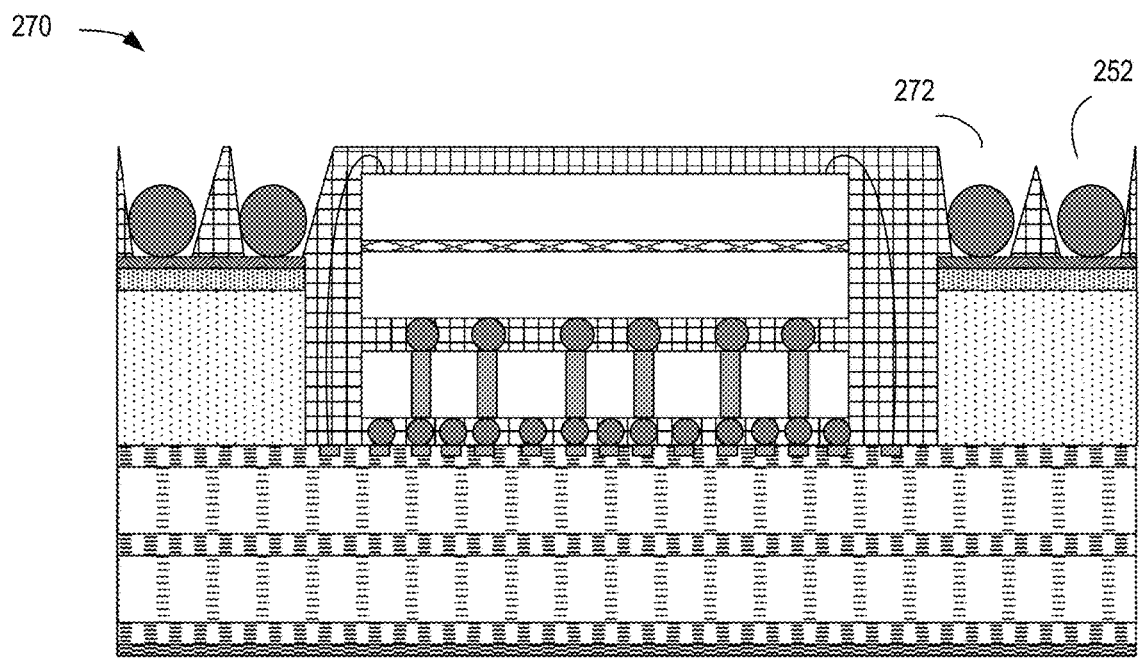

FIG. 2H shows assembly 270, which may include through-mold vias 272 that have been formed in mold compound 262 to expose solder spheres 252. Through-mold vias 272 may be formed by laser ablation of mold compound 262. Through-mold vias 272 may have parallel or angled sides that expose approximately a top half of each of solder spheres 252.

Figure 2I:
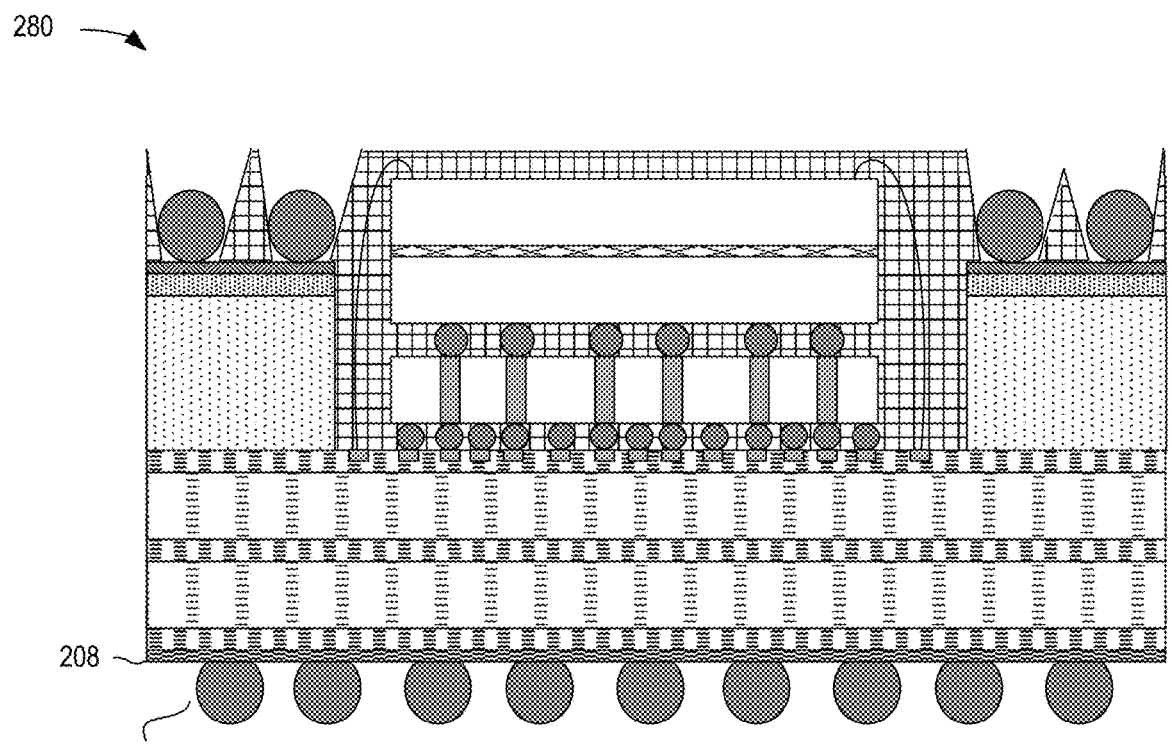

As shown in FIG. 2I, assembly 280 includes bumps 282 that have been attached to bottom surface 208. In some embodiments, bumps 282 represent solder balls, however other conductive means may be used, such as pins or lands, for example, to attach the assembled package to a socket, circuit board, or other package.

Figure 3:
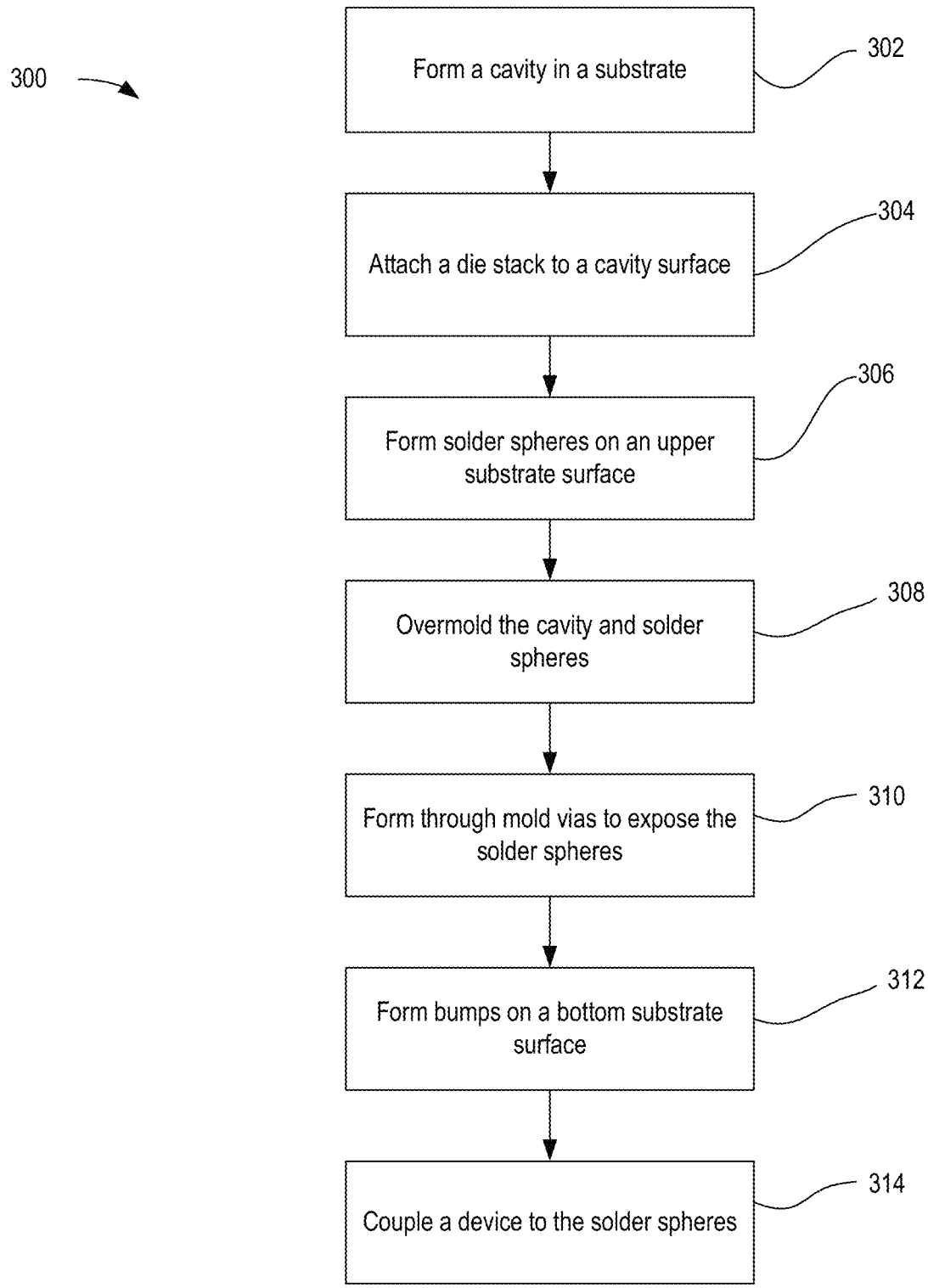
FIG. 3 illustrates a flowchart of a method of forming a stacked die cavity package, in accordance with some embodiments.

FIG. 3 illustrates a flowchart of a method of forming a package with wall-side capacitors, in accordance with some embodiments. Although the blocks in the flowchart with reference to FIG. 3 are shown in a particular order, the order of the actions can be modified. Thus, the illustrated embodiments can be performed in a different order, and some actions/blocks may be performed in parallel. Some of the blocks and/or operations listed in FIG. 3 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 300 begins with forming (302) a cavity in a substrate, such as cavity substrate 102. In some embodiments, a cavity 212 is formed by laser release or mechanical routing of a cuboid portion of prepreg material. In some embodiments, the prepreg material, such as dielectric layers 202 is not yet cured when the cavity is formed. In some embodiments, the cavity formed is greater than about 100 um deep and has a bottom surface over a metal layer.

Next, a die stack, such as die stack 104, is attached (304) to a cavity surface. In some embodiments, the die stack includes two or more devices that are mechanically, and possibly electrically, coupled in-situ with the substrate cavity. In other embodiments, a die stack is preassembled and attached as a single unit to the cavity substrate. In some embodiments, devices within a die stack are electrically coupled by through-silicon vias. In some embodiments, devices within a die stack are wirebonded to contacts on a cavity substrate surface.

Then, solder spheres, such as solder spheres 252, are formed (306) on an upper substrate surface 206. Next, in some embodiments, cavity 212 and solder spheres 252 are overmolded (308) with mold compound 262.

The method continues with forming (310) through-mold vias 272, in some embodiments, to expose solder spheres 252. In some embodiments, laser drilling is used to remove portions of mold compound 262. Next, bumps 282 are formed (312) on bottom surface 208, in some embodiments. Finally, device 108 may be coupled (314) with solder spheres on opposite sides of the (filled) cavity and die stack.

Figure 4:
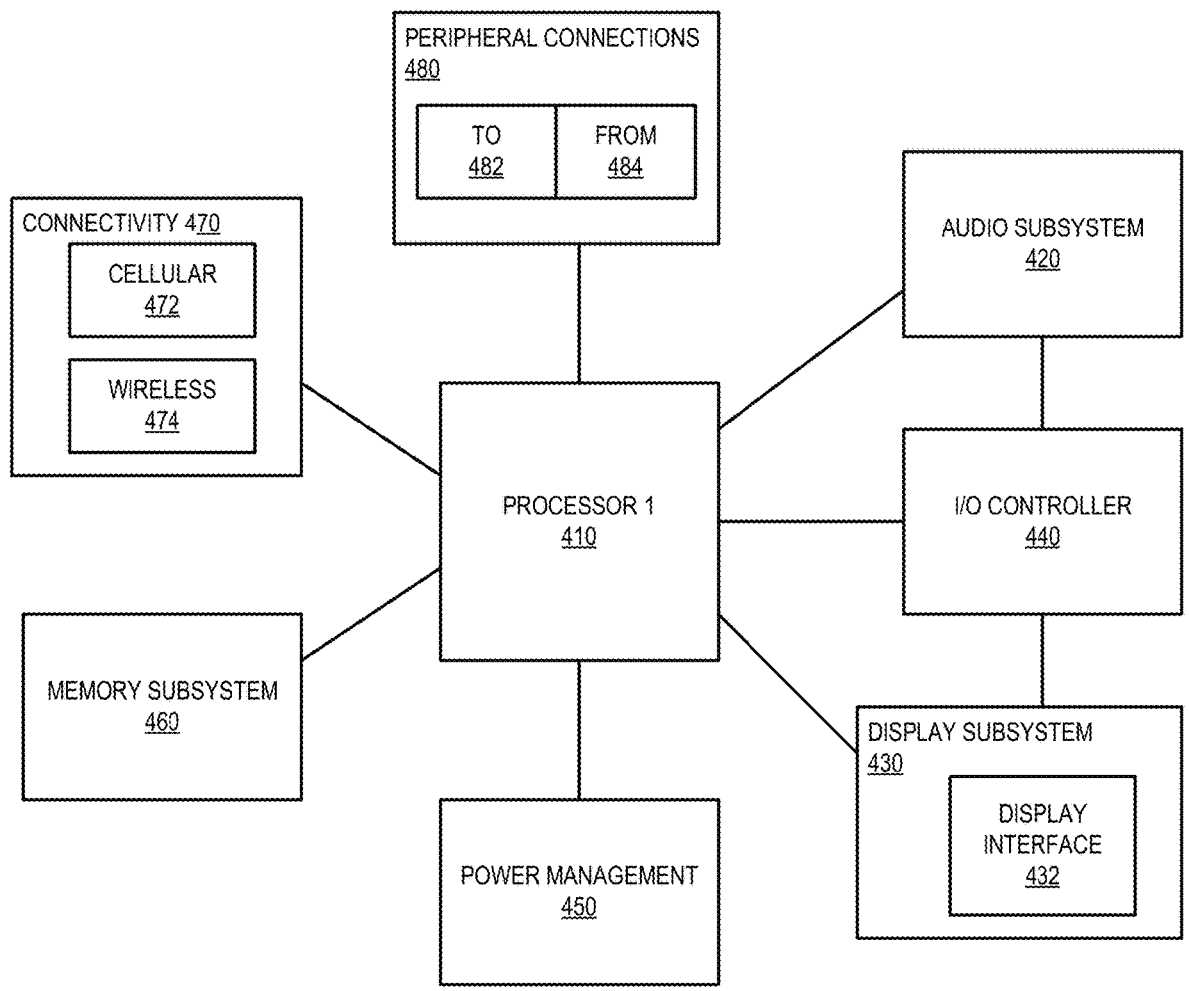
FIG. 4 illustrates a smart device or a computer system or a SoC (System-on-Chip) which includes a stacked die cavity package, according to some embodiments.

FIG. 4 illustrates a smart device or a computer system or a SoC (System-on-Chip) 400 which includes a stacked die cavity package, according to some embodiments. In some embodiments, computing device 400 represents a mobile computing device, such as a computing tablet, a mobile phone or smart-phone, a wireless-enabled e-reader, or other wireless mobile device. It will be understood that certain components are shown generally, and not all components of such a device are shown in computing device 400. In some embodiments, one or more components of computing device 400, for example processor 410 and/or memory subsystem 460, are included in a package with wall-side capacitors as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 400 includes a first processor 410. The various embodiments of the present disclosure may also comprise a network interface within 470 such as a wireless interface so that a system embodiment may be incorporated into a wireless device, for example, cell phone or personal digital assistant.

In one embodiment, processor 410 can include one or more physical devices, such as microprocessors, application processors, microcontrollers, programmable logic devices, or other processing means. The processing operations performed by processor 410 include the execution of an operating platform or operating system on which applications and/or device functions are executed. The processing operations include operations related to I/O (input/output) with a human user or with other devices, operations related to power management, and/or operations related to connecting the computing device 400 to another device. The processing operations may also include operations related to audio I/O and/or display I/O.

In one embodiment, computing device 400 includes audio subsystem 420, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 400, or connected to the computing device 400. In one embodiment, a user interacts with the computing device 400 by providing audio commands that are received and processed by processor 410.

Display subsystem 430 represents hardware (e.g., display devices) and software (e.g., drivers) components that provide a visual and/or tactile display for a user to interact with the computing device 400. Display subsystem 430 includes display interface 432, which includes the particular screen or hardware device used to provide a display to a user. In one embodiment, display interface 432 includes logic separate from processor 410 to perform at least some processing related to the display. In one embodiment, display subsystem 430 includes a touch screen (or touch pad) device that provides both output and input to a user.

I/O controller 440 represents hardware devices and software components related to interaction with a user. I/O controller 440 is operable to manage hardware that is part of audio subsystem 420 and/or display subsystem 430. Additionally, I/O controller 440 illustrates a connection point for additional devices that connect to computing device 400 through which a user might interact with the system. For example, devices that can be attached to the computing device 400 might include microphone devices, speaker or stereo systems, video systems or other display devices, keyboard or keypad devices, or other I/O devices for use with specific applications such as card readers or other devices.

As mentioned above, I/O controller 440 can interact with audio subsystem 420 and/or display subsystem 430. For example, input through a microphone or other audio device can provide input or commands for one or more applications or functions of the computing device 400. Additionally, audio output can be provided instead of, or in addition to display output. In another example, if display subsystem 430 includes a touch screen, the display device also acts as an input device, which can be at least partially managed by I/O controller 440. There can also be additional buttons or switches on the computing device 400 to provide I/O functions managed by I/O controller 440.

In one embodiment, I/O controller 440 manages devices such as accelerometers, cameras, light sensors or other environmental sensors, or other hardware that can be included in the computing device 400. The input can be part of direct user interaction, as well as providing environmental input to the system to influence its operations (such as filtering for noise, adjusting displays for brightness detection, applying a flash for a camera, or other features).

In one embodiment, computing device 400 includes power management 450 that manages battery power usage, charging of the battery, and features related to power saving operation. Memory subsystem 460 includes memory devices for storing information in computing device 400. Memory can include nonvolatile (state does not change if power to the memory device is interrupted) and/or volatile (state is indeterminate if power to the memory device is interrupted) memory devices. Memory subsystem 460 can store application data, user data, music, photos, documents, or other data, as well as system data (whether long-term or temporary) related to the execution of the applications and functions of the computing device 400.

Elements of embodiments are also provided as a machine-readable medium (e.g., memory 460) for storing the computer-executable instructions. The machine-readable medium (e.g., memory 460) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 470 includes hardware devices (e.g., wireless and/or wired connectors and communication hardware) and software components (e.g., drivers, protocol stacks) to enable the computing device 400 to communicate with external devices. The computing device 400 could be separate devices, such as other computing devices, wireless access points or base stations, as well as peripherals such as headsets, printers, or other devices.

Connectivity 470 can include multiple different types of connectivity. To generalize, the computing device 400 is illustrated with cellular connectivity 472 and wireless connectivity 474. Cellular connectivity 472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 474 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 480 include hardware interfaces and connectors, as well as software components (e.g., drivers, protocol stacks) to make peripheral connections. It will be understood that the computing device 400 could both be a peripheral device ("to" 482) to other computing devices, as well as have peripheral devices ("from" 484) connected to it. The computing device 400 commonly has a "docking" connector to connect to other computing devices for purposes such as managing (e.g., downloading and/or uploading, changing, synchronizing) content on computing device 400. Additionally, a docking connector can allow computing device 400 to connect to certain peripherals that allow the computing device 400 to control content output, for example, to audiovisual or other systems.

In addition to a proprietary docking connector or other proprietary connection hardware, the computing device 400 can make peripheral connections 480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a plurality of dielectric layers forming a substrate; a plurality of first conductive contacts on a first surface of the substrate; a cavity in the first surface of the substrate defining a second surface parallel to the first surface; a plurality of second conductive contacts on the second surface of the substrate; one or more integrated circuit die(s) coupled with the second conductive contacts; and mold material at least partially covering the one or more integrated circuit die(s) and the first conductive contacts.

Some embodiments also include a core layer within the substrate. Some embodiments also include a memory device coupled with the first conductive contacts, the memory device spanning the cavity. In some embodiments, the cavity comprises a depth of greater than about 100 um. In some embodiments, the first conductive contacts comprise solder forms.

In some embodiments, the one or more integrated circuit die(s) comprises: a first integrated circuit die coupled with the second conductive contacts; and a second integrated circuit die coupled with the first integrated circuit die by through silicon vias.

In another example, an integrated circuit package is provided comprising: a substrate comprising: a first surface; a cavity in the first surface defining a second surface parallel to the first surface; solder forms on the first surface on opposite sides of the cavity; and conductive contacts on the second surface; one or more integrated circuit die(s) coupled with the conductive contacts on the second surface; mold material covering the one or more integrated circuit die(s); and an integrated circuit device coupled with the solder forms on opposite sides of the cavity.

In some embodiments, the one or more integrated circuit devices comprises: a first integrated circuit die coupled with conductive contacts on the second surface; and a second integrated circuit die coupled with a top surface of the first integrated circuit die. Some embodiments also include the second integrated circuit die conductively coupled with conductive contacts on the second surface through wire-bonding. In some embodiments, the cavity comprises a depth of greater than about 100 um. In some embodiments, the one or more integrated circuit die(s) comprises a processor. In some embodiments, the integrated circuit device coupled with the solder forms comprises a memory device.

In another example, a system is provided comprising: a display subsystem; a wireless communication interface; and an integrated circuit package, the integrated circuit package comprising: a substrate comprising: a first surface; a cavity in the first surface defining a second surface parallel to the first surface; solder forms on the first surface on opposite sides of the cavity; and conductive contacts on the second surface; one or more integrated circuit die(s) coupled with the conductive contacts on the second surface; and a memory device coupled with the solder forms on opposite sides of the cavity.

Some embodiments also include mold material covering the one or more integrated circuit die(s) and the solder forms, wherein the memory device coupled with the solder forms by through-mold vias. In some embodiments, the cavity comprises a depth of greater than about 100 um. In some embodiments, the one or more integrated circuit devices comprises a processor. In some embodiments, the one or more integrated circuit devices comprises: a first integrated circuit die coupled with conductive contacts on the second surface; and a second integrated circuit die coupled with a top surface of the first integrated circuit die. In some embodiments, the second integrated circuit die is conductively coupled with the first integrated circuit die by through silicon vias.

In another example, a method is provided comprising: forming a substrate with a cavity defining a lower surface and an upper surface parallel to the lower surface; forming solder forms on the upper surface; attaching one or more die(s) to the lower surface of the substrate; overmolding the one or more die(s) and the solder forms; and forming through mold vias to expose the solder forms.

In some embodiments, forming a substrate with a cavity comprises: combining layers of prepreg and copper; removing a cuboid portion of prepreg that extends from the upper surface of the substrate to a copper layer; and curing the prepreg. In some embodiments, removing a cuboid portion of prepreg comprises laser release. In some embodiments, attaching one or more die(s) comprises: coupling a first integrated circuit die to contacts on the lower surface; and coupling a second integrated circuit die to a surface of the first integrated circuit die.

Some embodiments also include attaching a device to the solder forms on the upper surface of the substrate, wherein the device spans the cavity. In some embodiments, the device comprises a memory device. In some embodiments, attaching one or more die(s) comprises coupling contacts of an integrated circuit die with through silicon vias.

In another example, a stacked die cavity integrated circuit device package is provided comprising: means of forming a substrate; a plurality of first conductive means on a first surface of the substrate; a cavity in the first surface of the substrate defining a second surface parallel to the first surface; a plurality of second conductive means on the second surface of the substrate; one or more integrated circuit die(s) coupled with the second conductive contacts; and insulating means at least partially covering the one or more integrated circuit die(s) and the first conductive contacts.

In some embodiments, the means for forming a substrate comprises a substrate core. Some embodiments also include a memory device coupled with the first conductive contacts, the memory device spanning the cavity. In some embodiments, the cavity comprises a depth of greater than about 100 um. In some embodiments, the first conductive means comprise solder forms. In some embodiments, the one or more integrated circuit die(s) comprises: a first integrated circuit die coupled with the second conductive means; and a second integrated circuit die coupled with the first integrated circuit die by through silicon vias.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
   forming a substrate with a cavity defining a lower surface and an upper surface parallel to the lower surface;
   forming solder spheres on the upper surface;
   attaching one or more die(s) to the lower surface of the substrate, wherein the one or more die(s) extend beyond the upper surface;
   overmolding the one or more die(s) and the solder spheres; and
   forming through mold vias to expose the solder spheres.

2. The method of claim 1, wherein forming a substrate with a cavity comprises:
   combining layers of prepreg and copper;
   removing a cuboid portion of prepreg that extends from the upper surface of the substrate to a copper layer; and
   curing the prepreg.

3. The method of claim 2, wherein removing a cuboid portion of prepreg comprises laser release.

4. The method of claim 1, wherein attaching one or more die(s) comprises:
   coupling a first integrated circuit die to contacts on the lower surface; and coupling a second integrated circuit die to a surface of the first integrated circuit die.

5. The method of claim 1, further comprising attaching a device to the solder spheres on the upper surface of the substrate, wherein the device spans the cavity.

6. The method of claim 5, wherein the device comprises a memory device.

7. The method of claim 1, wherein attaching one or more die(s) comprises coupling contacts of an integrated circuit die with through silicon vias.

* * * * *